US008241945B2

(12) United States Patent  
Payne et al.

(10) Patent No.: US 8,241,945 B2
(45) Date of Patent: Aug. 14, 2012

(54) SOLAR CELLS AND METHODS OF FABRICATION THEREOF

(75) Inventors: Adam M. Payne, Dunwoody, GA (US); Daniel L. Meier, Norcross, GA (US); Vinodh Chandrasekaran, Suwanee, GA (US)

(73) Assignee: Suniva, Inc., Norcross, GA (US)

( * ) Notice: Subject to any disclaimer, the term of this patent is extended or adjusted under 35 U.S.C. 154(b) by 61 days.

(21) Appl. No.: 12/701,908

(22) Filed: Feb. 8, 2010

(65) Prior Publication Data

US 2011/0132448 A1  Jun. 9, 2011

(51) Int. Cl.
*H01L 31/02* (2006.01)

(52) U.S. Cl. ... 438/98; 136/243; 136/256; 257/E27.123; 257/E27.124; 257/E27.126; 438/940

(58) Field of Classification Search .......... 257/E27.123–27.126; 136/256; 438/98, 940
See application file for complete search history.

(56) References Cited

U.S. PATENT DOCUMENTS

| | | | |
|---|---|---|---|
| 5,886,368 A | 3/1999 | Forbes et al. |
| 5,926,740 A | 7/1999 | Forbes et al. |
| 6,031,263 A | 2/2000 | Forbes et al. |
| 6,180,869 B1 | 1/2001 | Meier et al. |
| 6,249,020 B1 | 6/2001 | Forbes et al. |
| 6,262,359 B1 | 7/2001 | Meier et al. |
| 6,307,775 B1 | 10/2001 | Forbes et al. |
| 6,309,907 B1 | 10/2001 | Forbes et al. |
| 6,492,694 B2 | 12/2002 | Noble et al. |
| 6,504,224 B1 | 1/2003 | Ahn et al. |
| 6,541,859 B1 | 4/2003 | Forbes et al. |
| 6,573,169 B2 | 6/2003 | Noble et al. |
| 6,632,730 B1 | 10/2003 | Meier et al. |
| 6,664,631 B2 | 12/2003 | Meier et al. |
| 6,683,277 B1 | 1/2004 | Millard et al. |
| 6,703,295 B2 | 3/2004 | Meier et al. |
| 6,731,531 B1 | 5/2004 | Forbes et al. |
| 6,737,340 B2 | 5/2004 | Meier et al. |
| 6,746,893 B1 | 6/2004 | Forbes et al. |
| 6,762,068 B1 | 7/2004 | Forbes et al. |
| 6,781,876 B2 | 8/2004 | Forbes et al. |
| 6,794,255 B1 | 9/2004 | Forbes et al. |

(Continued)

FOREIGN PATENT DOCUMENTS

WO   WO 2007/110482 A1   10/2007

(Continued)

OTHER PUBLICATIONS

Solid-State Q-Switched Ultraviolet Lasers, AVIA 355-10 (Brochure), Coherent, Inc., 2007, 2 pages.

(Continued)

*Primary Examiner* — Mamadou Diallo
(74) *Attorney, Agent, or Firm* — Alston & Bird LLP

(57) ABSTRACT

Solar cells and methods for fabrication thereof are provided. A method may include forming a via through at least one dielectric layer formed on a semiconductor wafer by using a laser to ablate a region of the at least one dielectric layer such that at least a portion of the surface of the semiconductor wafer is exposed by the via. The method may further include applying a self-doping metal paste to the via. The method may additionally include heating the semiconductor wafer and self-doping metal paste to a temperature sufficient to drive at least some dopant from the self-doping metal paste into the portion of the surface of the semiconductor wafer exposed by the via to form a selective emitter region and a contact overlying and self-aligned to the selective emitter region.

18 Claims, 12 Drawing Sheets

U.S. PATENT DOCUMENTS

| | | |
|---|---|---|
| 6,797,919 B1 | 9/2004 | Millard et al. |
| 6,835,638 B1 | 12/2004 | Forbes et al. |
| 6,879,017 B2 | 4/2005 | Ahn et al. |
| 6,911,667 B2 | 6/2005 | Pichler et al. |
| 6,936,849 B1 | 8/2005 | Forbes et al. |
| 6,949,389 B2 | 9/2005 | Pichler et al. |
| 6,965,123 B1 | 11/2005 | Forbes et al. |
| 7,005,344 B2 | 2/2006 | Forbes et al. |
| 7,109,548 B2 | 9/2006 | Forbes et al. |
| 7,141,824 B2 | 11/2006 | Forbes et al. |
| 7,151,342 B2 | 12/2006 | Sellars et al. |
| 7,154,153 B1 | 12/2006 | Forbes et al. |
| 7,169,666 B2 | 1/2007 | Forbes et al. |
| 7,186,664 B2 | 3/2007 | Ahn et al. |
| 7,196,929 B1 | 3/2007 | Forbes et al. |
| 7,242,049 B2 | 7/2007 | Forbes et al. |
| 7,276,724 B2 | 10/2007 | Sheats et al. |
| 7,450,295 B2 | 11/2008 | Tung et al. |
| 7,485,576 B2 | 2/2009 | Suh et al. |
| 2003/0205845 A1 | 11/2003 | Pichler et al. |
| 2003/0207500 A1 | 11/2003 | Pichler et al. |
| 2005/0183767 A1 | 8/2005 | Yu et al. |
| 2005/0189015 A1 | 9/2005 | Rohatgi et al. |
| 2005/0189331 A1 | 9/2005 | Millard et al. |
| 2005/0247340 A1 | 11/2005 | Zeira |
| 2005/0248260 A1 | 11/2005 | Sellars et al. |
| 2005/0252544 A1 | 11/2005 | Rohatgi et al. |
| 2006/0157103 A1 | 7/2006 | Sheats et al. |
| 2006/0160261 A1 | 7/2006 | Sheats et al. |
| 2006/0199088 A1 | 9/2006 | McCollough et al. |
| 2006/0231130 A1 | 10/2006 | Sharps et al. |
| 2007/0000537 A1 | 1/2007 | Leidholm et al. |
| 2007/0040493 A1 | 2/2007 | Sellars et al. |
| 2007/0125419 A1 | 6/2007 | Gui et al. |
| 2007/0186971 A1 | 8/2007 | Lochun et al. |
| 2007/0206267 A1 | 9/2007 | Tung et al. |
| 2007/0216300 A1 | 9/2007 | Lee et al. |
| 2008/0018232 A1 | 1/2008 | Zhang et al. |
| 2008/0020503 A1 | 1/2008 | Sheats et al. |
| 2008/0092952 A1 | 4/2008 | Chen et al. |
| 2008/0135099 A1 | 6/2008 | Yu et al. |
| 2008/0217622 A1 | 9/2008 | Goyal |
| 2008/0223428 A1 | 9/2008 | Zeira |
| 2008/0230779 A1 | 9/2008 | Goyal |
| 2008/0289680 A1 | 11/2008 | MacFarlane |
| 2009/0017617 A1 | 1/2009 | Rohatgi et al. |
| 2009/0025786 A1 | 1/2009 | Rohatgi et al. |
| 2009/0059345 A1 | 3/2009 | Tung et al. |
| 2009/0104369 A1 | 4/2009 | Rajala et al. |

FOREIGN PATENT DOCUMENTS

| | | |
|---|---|---|
| WO | WO 2008/105804 A2 | 9/2008 |
| WO | WO 2008/112115 A1 | 9/2008 |

OTHER PUBLICATIONS

High Power Industrial Picosecond Laser, Super Rapid, (Brochure), Lumera Laser GmbH, undated, 2 pages.

HIPPO™ High Power Q-Switched Laser, Spectra-Physics (Brochure), Oct. 2007, 4 pages.

Besi-Vetrella, U. et al., *Large Area, Screen Printed Silicon Solar Cells With Selective Emitter Made by Laser Overdoping and RTA Spin-on Glasses*, 26th PVSC, Sep. 30-Oct. 3, 1997, Anaheim, CA; pp. 135-138.

Besi-Vetrella, U. et al., *Selective Doping of Silicon by Rapid Thermal and Laser Assisted Processes*, Materials Science in Semiconductor Processing, 1, (1998), pp. 325-329.

Dunsky, C. et al., *Solid State Laser Applications in Photovoltaics Manufacturing*, Proc. of SPIE, vol. 6871, pp. 687129-1-687129-10.

Engelhart, P. et al., *Laser Ablation of $SiO_2$ for Locally Contacted Si Solar Cells With Ultra-Short Pulses*, Prog. Photovolt. Res. Appl., 15, 2007, pp. 521-527.

Engelhart, P. et al., *Laser Structuring for Back Junction Silicon Solar Cells*, Prog. Photovolt. Res. Appl., 15, (2007), pp. 237-243.

Glunz, S. W. et al., *Analysis of Laser-Fired Local Back Surface Fields Using $n^+np^+$ Cell Structures*, 3rd World Conference on Photovoltaic Energy Conversion, May 11-18, 2003, Osaka, Japan, pp.1332-1335.

Grohe, A. et al., *Selective Laser Ablation of Anti-Reflection Coatings for Noval Metallization Techniques*, IEEE, 2006, pp. 1399-1402.

Hameiri, Z. et al., *Double Sided Laser Doped Solar Cells*, ARC Photovoltaics Centre of Excellence, The University of New South Wales, Kensington, Australia, (undated), 2 pages.

Hermann, S. et al., *Process Characterisation of Picosecond Laser Ablation of $SIO_2$ and $SIN_X$ Layers on Planar and Textured Surfaces*, Institut fur Solarenergieforschung Hameln, Emmerthan, Germany and Trumpf-Laser GmbH & Col. KG, Schramberg,Germany, (undated) 5 pages.

Knorz, A. et al., *Progress in Selective Laser Ablation of Dielectric Layers*, 22nd European Photovoltaic Solar Energy Conference and Exhibition, Sep. 3-7, 2007, Milan, Italy, 4 pages.

Mai, L. et al., *Aluminum-Alloyed Rear Junction Laser Doped Contact Solar Cells on CZ N-Type Silicon*, ARC Photovoltaics Centre of Excellence, The University of New South Wales, Kensington, Australia, (undated), 2 pages.

Pirozzi, L. et al., *Innovative Applications of Laser Technology in Photovoltaics*, SPIE, vol. 2991, 1997, pp. 119-127.

Pirozzi, L. et al., *Selective Emitters in Buried Contact Silicon Solar Cells: Some Low-Cost Solutions*, Solar Energy Materials & Solar Cells, 65, (2001), pp. 287-295.

Schneiderlochner, E. et al., *Laser-Fired Rear Contacts for Crystalline Silicon Solar Cells*, Progress in Photovoltaics: Research and Applications, Prog. Photovolt: Res. Appl. 2002, 10, pp. 29-34.

Schneiderlochner, E. et al., *Scanning ND:YAG Laser System for Industrially Applicable Processing in Silicon Solar Cell Manufacturing*, 3rd World Conference on Photovoltaic Energy Conversion, May 11-18, 2003, Osaka, Japan, pp. 1364-1367.

Ventura, L. et al., *Influence of Baking Conditions of Doped Spin-on Glass Sources on the Formation of Laser Assisted Selective Emitters*, 25th PVSC, May 13-17, 1996, Washington, DC, pp. 577-580.

Wood, R. F. et al., *Excimer Laser-Processed Oxide-Passivated Silicon Solar Cells of 19.5-Percent Efficiency*, IEEE Electron Device Letters, vol. EDL-8, No. 5, May 1987, pp. 249-251.

| OPPOSITELY DOPED LAYER 910 |
|---|
| DOPED SEMICONDUCTOR 900 |
*FIG. 9A*
| DIELECTRIC LAYER 920 |
|---|
| OPPOSITELY DOPED LAYER 910 |
| DOPED SEMICONDUCTOR 900 |
| DIELECTRIC LAYER 930 |
*FIG. 9B*
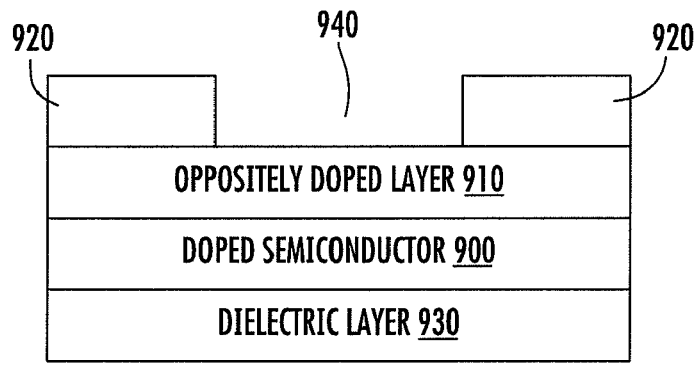
*FIG. 9C*
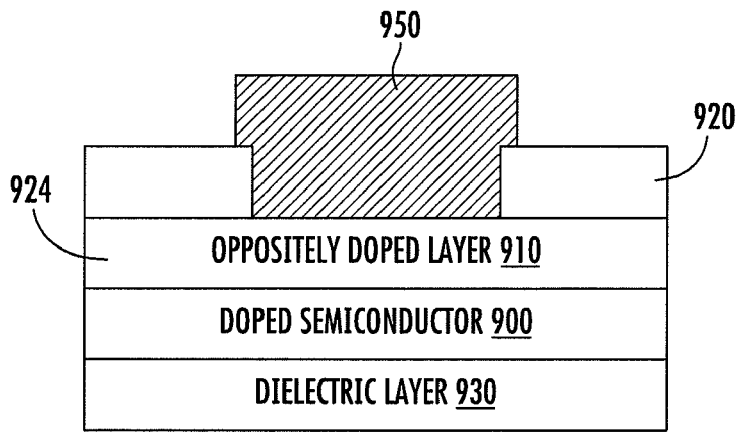
*FIG. 9D*

SOLAR CELLS AND METHODS OF FABRICATION THEREOF

TECHNOLOGICAL FIELD

Embodiments of the present invention relate generally to solar cells. More particularly, embodiments of the present invention relate to solar cells and methods for fabricating solar cells using a laser in the fabrication process.

BACKGROUND

For many years, effort has been made to utilize the energy from the sun to produce electricity. On a clear day the sun provides approximately one thousand watts of energy per square meter almost everywhere on the planet's surface. The historical intention has been to collect this energy by using, for example, an appropriate solar semiconductor device. The collected energy is used to produce power by the creation of a suitable voltage and to maximize amperage, which is represented by the flow of electrons. However, to date, many photovoltaic or solar cells typically have low overall efficiency.

The success of the solar cell industry has been impeded due to this lack of efficiency in solar cell fabrication and usage. For example, it is relatively expensive to manufacture the semiconductor materials currently utilized for solar cells and applicable processes. One traditional approach for manufacturing solar cells has included converting low quality silicon wafers into solar cells by known techniques for treating low quality solar cells, which include etching of the wafers and subsequent processing of the silicon wafers so that they can function as solar cells. A second technique includes creating relatively thin layers of crystalline and/or amorphous silicon upon an appropriate substrate followed by processing techniques, which ultimately result in the production of a solar cell/solar panel. However, the extensive processes used in the above described approaches have historically been relatively inefficient, making the solar cell industry less than ideal.

Thus, a heretofore unaddressed need exists in the solar cell industry for solar cells and processes for fabricating the solar cells that address the aforementioned deficiencies and/or inadequacies.

BRIEF SUMMARY OF SOME EXAMPLES OF THE INVENTION

Solar cells and methods of fabrication thereof are therefore provided. In this regard, embodiments of the invention provide several advantages for production of solar cells that may reduce time and cost required for producing solar cells. Some embodiments of the invention provide a fabrication method by which laser ablation is used to form vias through a dielectric layer covering the front side of a semiconductor wafer to expose at least a portion of the surface of the semiconductor wafer. According to some embodiments of the fabrication method, a self-doping metal paste is then applied to the vias and the semiconductor wafer and applied self-doping metal paste are heated. As a result of the heating, a selective emitter region is formed on the front surface of the semiconductor wafer and a corresponding contact self-aligned to the underlying selective emitter region is formed in a single step. In some embodiments, the self-doping metal paste comprises a fritless metal paste, as ablation of the region of the front side dielectric layer facilitates direct contact between the self-doping metal paste and the exposed portion of the semiconductor wafer, thus negating the need to use glass frit to eat away the dielectric layer and eliminating the consumption of dopant by the glass frit.

In a first example embodiment, a method is provided, which comprises providing a substrate. The provided substrate of this embodiment comprises a semiconductor wafer having a front surface and a back surface and having at least one dielectric layer formed on the front surface of the semiconductor wafer. The semiconductor wafer of this embodiment is initially doped with a first type of charge carrier and comprises a P-N junction formed through doping the front surface of the semiconductor wafer with a second type of charge carrier, the second type of charge carrier being opposite to the first type of charge carrier. The method of this embodiment further comprises forming a via through the at least one dielectric layer by using a laser to ablate a region of the at least one dielectric layer such that a portion of the front surface of the semiconductor wafer is exposed by the via. The method of this embodiment additionally comprises applying a self-doping metal paste to a portion of the substrate such that the applied self-doping metal paste is applied to the via. The self-doping paste of this embodiment comprises a dopant comprising the second type of charge carrier. The method of this embodiment also comprises heating the substrate and self-doping metal paste to a temperature sufficient to drive at least some dopant from the self-doping metal paste into the portion of the front surface of the semiconductor wafer exposed by the via to form a selective emitter region and to form a contact overlying and self-aligned to the selective emitter region.

In another example embodiment, a solar cell is provided. The solar cell of this embodiment is at least partially formed through a process comprising providing a substrate. The provided substrate of this embodiment comprises a semiconductor wafer having a front surface and a back surface and having at least one dielectric layer formed on the front surface of the semiconductor wafer. The semiconductor wafer of this embodiment is initially doped with a first type of charge carrier and comprises a P-N junction formed through doping the front surface of the semiconductor wafer with a second type of charge carrier, the second type of charge carrier being opposite to the first type of charge carrier. The process of this embodiment further comprises forming a via through the at least one dielectric layer by using a laser to ablate a region of the at least one dielectric layer such that a portion of the front surface of the semiconductor wafer is exposed by the via. The process of this embodiment additionally comprises applying a self-doping metal paste to a portion of the substrate such that the applied self-doping metal paste is applied to the via. The self-doping paste of this embodiment comprises a dopant comprising the second type of charge carrier. The process of this embodiment also comprises heating the substrate and self-doping metal paste to a temperature sufficient to drive at least some dopant from the self-doping metal paste into the portion of the front surface of the semiconductor wafer exposed by the via to form a selective emitter region and to form a contact overlying and self-aligned to the selective emitter region.

In another example embodiment, a solar cell is provided. The solar cell of this embodiment comprises a semiconductor wafer having a front surface and a back surface. The semiconductor wafer of this embodiment is initially doped with a first type of charge carrier and comprises a P-N junction formed through doping the front surface of the semiconductor wafer with a second type of charge carrier. The second type of charge carrier is opposite to the first type of charge carrier. The solar cell of this embodiment further comprises a dielectric layer overlying the front surface of the semiconductor wafer. The solar cell of this embodiment additionally comprises a plurality of discontinuous vias through the dielectric layer. The solar cell of this embodiment also comprises a metal contact grid substantially overlying the plurality of discontinuous vias. The front surface of the semiconductor wafer of this embodiment comprises a plurality of discontinuous selective emitter regions. Each selective emitter region of this embodiment substantially underlies a via and has a higher doping concentration of the second type of charge carrier than adjacent regions of the front surface of the semiconductor wafer. The metal contact grid of this embodiment is in electrical contact with the P-N junction through the plurality of discontinuous vias at the selective emitter regions.

The above summary is provided merely for purposes of summarizing some example embodiments of the invention so as to provide a basic understanding of some aspects of the invention. Accordingly, it will be appreciated that the above described example embodiments are merely examples and should not be construed to narrow the scope or spirit of the invention in any way. It will be appreciated that the scope of the invention encompasses many potential embodiments, some of which will be further described below, in addition to those here summarized.

BRIEF DESCRIPTION OF THE DRAWING(S)

Having thus described embodiments of the invention in general terms, reference will now be made to the accompanying drawings, which are not necessarily drawn to scale, and wherein:

DETAILED DESCRIPTION

Figure 1:
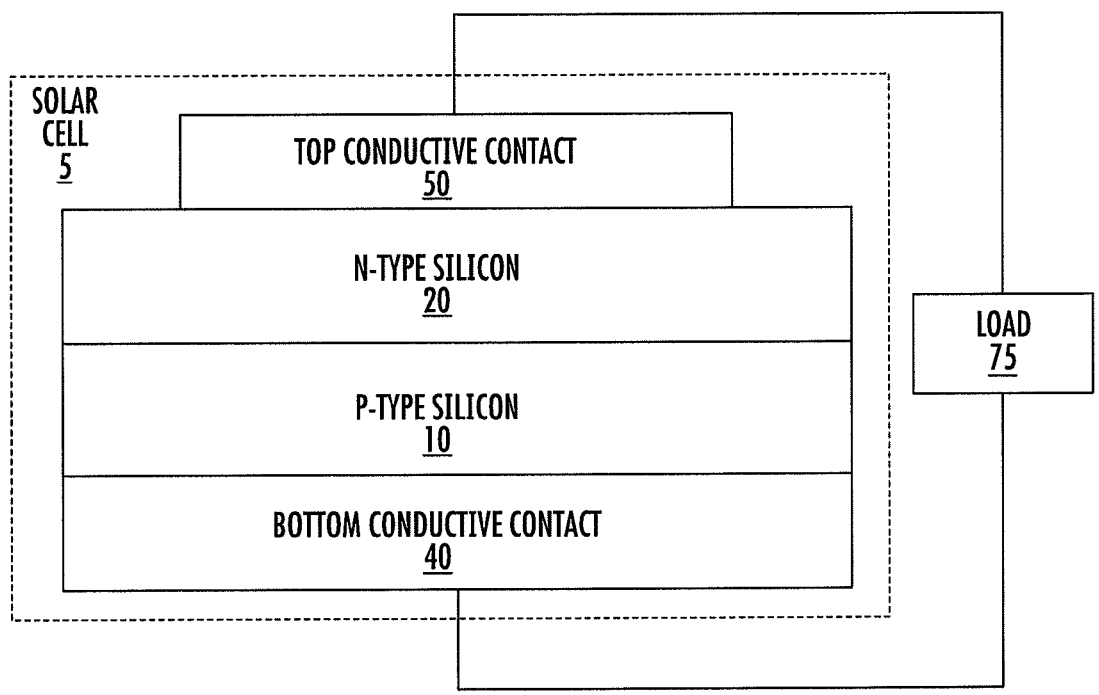
FIG. 1 illustrates a cross-sectional view of a solar cell which may be fabricated using embodiments of the present invention.

Some embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout.

Solar cells are devices that convert light energy into electrical energy. These devices are also often called photovoltaic (PV) cells. Solar cells are manufactured from a wide variety of semiconductors. One common semiconductor material is crystalline silicon.

Solar cells comprise three main elements: (1) a substrate; (2) a semiconductor junction; and (3) conductive contacts. Semiconductors such as silicon may be doped with a charge carrier, which may be n-type or p-type. When an n-type silicon and p-type silicon are formed in contact with one another, the region in the solar cell where they meet is referred to as a semiconductor junction, or "P-N junction." The semiconductor absorbs light. The energy from the light may be transferred to the valence electron of an atom in a silicon layer, which allows the valence electron to escape its bound state leaving behind a hole. These photogenerated electrons and holes are separated by the electric field associated with the p-n junction. The conductive contacts allow current to flow from the solar cell to an external circuit.

FIG. 1 illustrates the basic elements of one embodiment of a solar cell. The solar cell of FIG. 1 may be fabricated on a semiconductor wafer, such as, for example, a silicon wafer. The solar cell 5 comprises a p-type silicon base 10, an n-type silicon emitter 20, bottom conductive contact 40, and a top conductive contact 50. The p-type silicon base 10 and the n-type silicon emitter 20 contact to form the junction. The n-type silicon 20 is coupled to the top conductive contact 50. The p-type silicon 10 is coupled to the bottom conductive contact 40. The top conductive contact 50 and the bottom conductive contact 40 are coupled to a load 75 to provide it with electricity.

The top conductive contact 50 ("front contact"), comprising silver, enables electric current to flow into the solar cell 5. The top conductive contact 50, however, does not cover the entire face of the cell 5 because silver of the thickness required is not transparent to light. Thus, the top conductive contact 50 has a grid pattern to allow light to enter into the solar cell 5. Electrons flow from the top conductive contact 50, and through the load 75, before uniting with holes via the bottom conductive contact 40.

The bottom conductive contact 40 ("rear contact" or "back contact") usually comprises aluminum-silicon eutectic. This conductive contact 40 typically covers the entire bottom of the p-type silicon 10 in order to maximize conduction. The aluminum is alloyed with silicon at a temperature above the aluminum-silicon eutectic temperature of 577 degrees Celsius. This temperature may, for example, be approximately 750 degrees Celsius. This alloying reaction creates a heavily-doped p-type region at the bottom of the base and gives rise to a strong electric field there. This field aids in repelling the light-generated electrons from recombining with holes at the back contact so that they can be collected more efficiently at the p-n junction.

Figure 2:
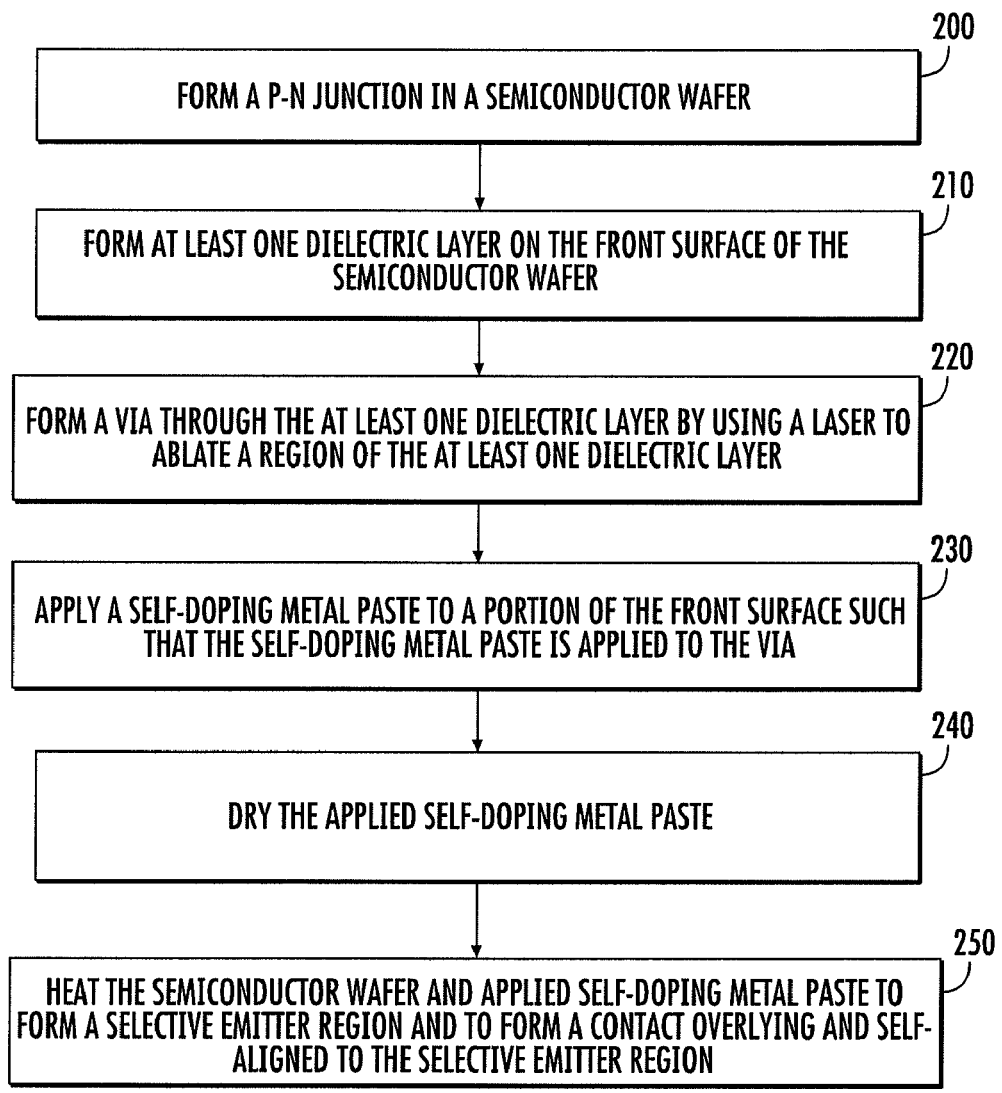
FIG. 2 illustrates a flowchart according to an exemplary method for fabricating a solar cell according to an exemplary embodiment of the present invention.

The solar cell illustrated in FIG. 1 may benefit from the invention disclosed herein. In this regard, embodiments of the invention provide for improved methods for formation of solar cells. FIG. 2 illustrates a flowchart according to an exemplary method for fabricating a solar cell according to an exemplary embodiment of the present invention. Operation 200 comprises forming a P-N junction in a semiconductor wafer. For purposes of example, but not by way of limitation, a silicon wafer will be referred to herein. However, it will be appreciated that other semiconductor wafer materials, such as, for example, germanium, silicon-germanium, and/or the like, may be substituted for silicon within the scope of the invention. The silicon wafer may comprise a crystalline wafer, which may, for example, be formed using the Czochralski process.

During formation, the silicon wafer may be initially doped with a dopant having a first type of charge carrier (e.g., either P-type or N-type charge carrier). In order to form a P-type silicon wafer, the silicon wafer may be formed and/or doped with a P-type dopant, such as, for example, aluminum, gallium, boron, indium, and/or the like. Similarly, in order to form an N-type silicon wafer, the silicon wafer may be formed and/or doped with an N-type dopant, such as, for example arsenic, antimony, phosphorus, and/or the like. For purposes of example, but not by way of limitation, the method illustrated in FIG. 2 will be described with respect to a P-type silicon wafer. However, it will be appreciated that the process described in FIG. 2 may be applied to N-type silicon wafers as well.

The P-N junction may be formed in operation 200 by doping the front surface of the silicon wafer with an N-type dopant. It will be appreciated that in embodiments wherein the silicon wafer comprises an N-type silicon wafer, the P-N junction may be formed by doping the front surface of the silicon wafer with a P-type dopant (e.g., a dopant having a second type of charge carrier opposite to the first type of charge carrier with which the silicon wafer is initially doped). The front surface of the silicon wafer may be doped through ion implantation, thermal diffusion, epitaxial growth and/or other techniques for doping a semiconductor wafer.

One or more dielectric layers may be formed on at least the front surface of the silicon wafer, at operation 210. The one or more dielectric layers may comprise, for example, a layer of silicon nitride, a layer of silicon dioxide, a layer of aluminum oxide, a layer of titanium oxide, a layer of silicon carbide, a layer of hydrogenated amorphous silicon, a layer of alloyed hydrogenated amorphous silicon (e.g., alloyed with germanium, carbon, and/or the like), a layer of silicon oxynitride a layer of some combination thereof, and/or the like. For example, in an embodiment wherein the P-N junction is formed through ion implantation, the one or more dielectric layers may comprise a first layer comprising silicon dioxide disposed on the front surface of the silicon wafer and a second layer comprising silicon nitride, which also serves as an anti-reflective coating, disposed on top of the first layer. In another example embodiment wherein the P-N junction is formed through thermal diffusion, at least one dielectric layer may comprise only a silicon nitride layer. The one or more dielectric layers may be formed using any appropriate method(s) for formation of dielectric layers. For example, a dielectric layer may be formed through a spin-on process during which dielectric in liquid form is deposited onto a wafer which is then spun to distribute the liquid. In another example, a dielectric layer may be formed using a physical vapor deposition process such as sputtering, a chemical vapor deposition process such as atomic layer deposition, a plasma enhanced chemical vapor deposition (PECVD) process and/or by some other suitable method.

Following formation of the one or more dielectric layers, operation 220 comprises forming one or more vias through the one or more dielectric layers. A via may, for example, comprise a hole or opening drilled or otherwise formed at least partially through a portion of a dielectric layer. A cross section of such a via may have any shape, such as, for example, a round shape, an elliptical shape, a square shape, an irregular shape, or the like. In an exemplary embodiment, a laser is used to form (e.g., drill) a via by ablation of a region of at least one dielectric layer such that a portion of the front surface (e.g., the N-type doped surface) of the silicon wafer is exposed by the via. The formed via(s) may comprise "blind vias."

Prior to firing the laser to form a via, the silicon wafer is placed in a receptacle (e.g., a tray) of a laser housing such that the laser may be focused on a region of the silicon wafer. The silicon wafer may be placed in the receptacle of the laser housing using, for example, a loader, interlock, or the like. In an exemplary embodiment, the laser comprises a class 4, high powered, ultraviolet laser. Example lasers that may be used include, for example, a COHERENT AVIA laser, a NEWPORT HIPPO or a Lumera Super-RAPID laser, or the like. The laser may comprise a shroud that is closed over the silicon wafer prior to firing the laser. The shroud may be configured such that an inert gas (e.g., nitrogen, argon, and/or the like) may be blown over the silicon wafer during firing of the laser to inhibit formation of an oxidation layer that may form on silicon exposed by ablation of a portion of the one or more dielectric layers.

One or more of the silicon wafer or the laser may then be aligned such that when the laser is fired, a via will be formed at a desired location. The silicon wafer may be aligned, for example, using edge alignment. In this regard, the edge of the silicon wafer may be identified and then the wafer may be aligned based on the identified edge position. In another example, the silicon wafer may be aligned using center alignment. In center alignment, an optical detection means (e.g., a camera) is used to identify the center of the silicon wafer and then the center of the wafer is aligned to a predetermined position. Additionally or alternatively, the laser focus may be aligned to a desired location, for example, by using mechanical movement of the laser emitter to focus the laser on the desired location. In another example, the laser may comprise a galvo scan head having optical elements, which may be adjusted to facilitate focus of the laser on the desired location.

Figure 3:
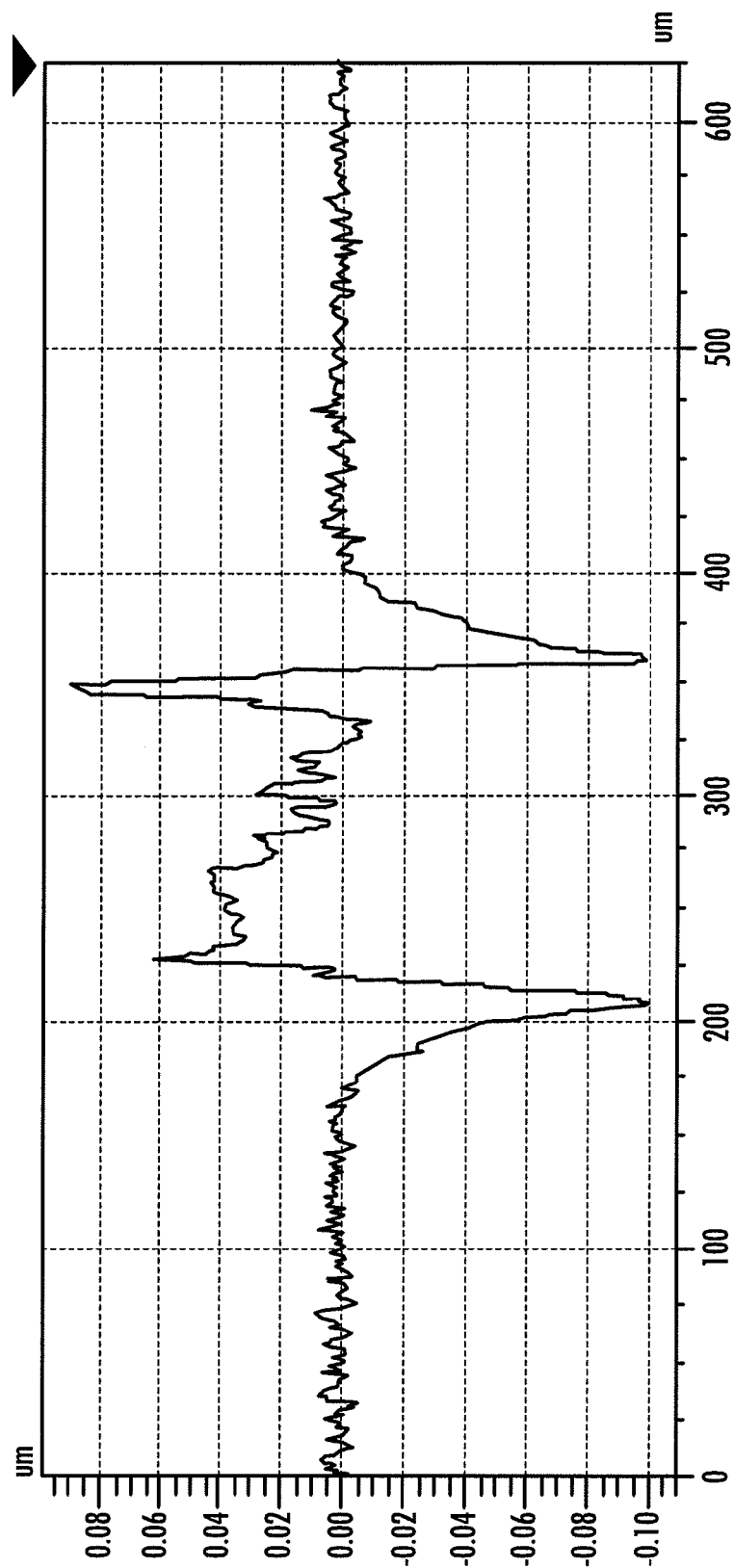
FIG. 3 illustrates a depth profile of a via formed according to an exemplary embodiment of the present invention.
Figure 4A:
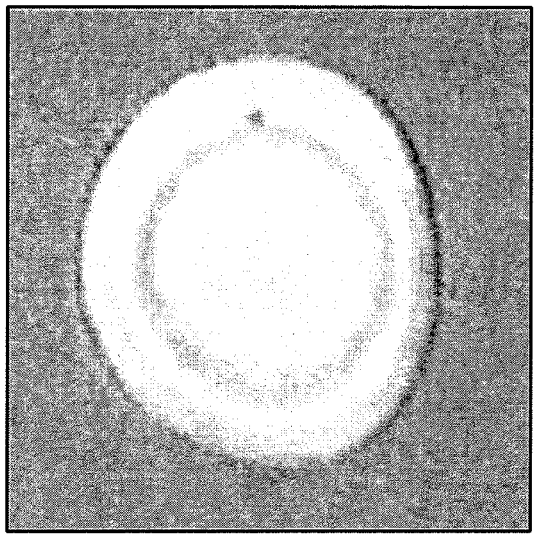
FIG. 4 illustrates a series of vias formed through ablation of silicon nitride dielectric using a series of laser fluence levels.
Figure 4B:
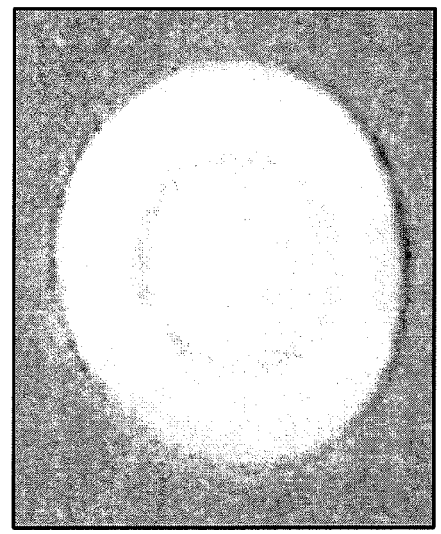
Figure 4C:
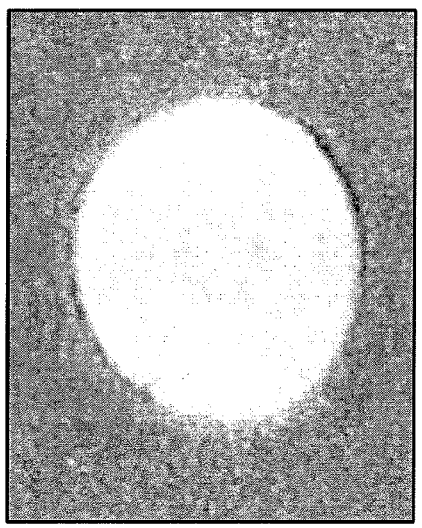
Figure 4D:
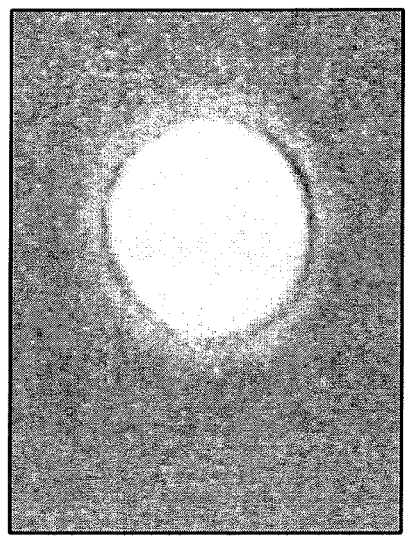

Once the silicon wafer and/or laser is aligned such that the laser is focused on the desired location for a via, the laser is fired such that a region of at least one dielectric layer is ablated to expose a portion of the front surface of the underlying silicon wafer. In this regard, a via according to an example embodiment comprises a hole through at least one dielectric layer. FIG. 3 illustrates a depth profile of a via created through a silicon nitride dielectric layer using a 266 nanometer nanosecond laser. The depth of the via is about 100 nanometers, which advantageously is not deep enough to puncture the P-N junction of the silicon wafer. The depth profile further illustrates that after having cooled, the surface of the silicon in the center of the via exposed through ablation of the silicon nitride dielectric layer has risen to a higher level than the silicon nitride surface surrounding the via.

It will be appreciated that the settings for the laser may be adjusted depending on the size and shape of via desired as well as on the type(s) and thickness of the dielectric layer(s) being ablated. One such setting that may be adjusted is the laser fluence level (e.g., the energy per unit area of the laser pulse). In this regard, FIG. 4 illustrates a series of vias formed through ablation of silicon nitride dielectric using a series of fluence levels. The series of vias are arranged from the via formed using a laser pulse having the highest fluence level in FIG. 4A to the via formed using the lowest laser pulse in FIG. 4D. As illustrated in FIG. 4, the fluence level may affect the ablation of the nitride (black) from the silicon (white). Higher fluence levels may cause melting in the underlying silicon, as illustrated by the ring within the white area of the removed nitride. Such melting may be undesirable because it may result in growth of an oxide layer over the melted silicon surface. Accordingly, an upper constraint on the fluence level used may be imposed by the fluence level at which melting of the silicon surface exceeds a tolerable level. In an example embodiment wherein the dielectric layer(s) to be ablated comprises a silicon nitride layer, a laser fluence level of greater than about 1 Joule per square centimeter is used. However, it will be appreciated that 1 Joule per square centimeter is provided merely for purposes of example. In other example embodiments wherein the dielectric layer(s) to be ablated comprises a silicon nitride layer, a laser fluence level in a range from about 0.12 Joules per square centimeter to about 5 Joules per square centimeter may be used.

Another setting that may be varied is the type of laser pulse profile used. In an exemplary embodiment, a top hat profile is used, which may prevent partial ablation of the dielectric layer outside of the desired via location. The top hat profile may further advantageously help to prevent growth of an oxide layer over silicon exposed by ablation of the dielectric layer. It will be appreciated, however, that a profile other than a top hat profile may be used including, for example, a Gaussian profile. The duration of a laser pulse used for ablation may also be adjusted. In an example embodiment, a pulse duration from about 1 picosecond to about 30 nanoseconds may be used.

In some embodiments of the invention, the targeted size of the via may be constricted by a number of factors. For example, a lower constraint on the size of a via may be imposed by the size of particles in the self-doping metal paste that will subsequently be applied over the via. See, e.g., operation 230 described herein below. In this regard, the via may need to be sized sufficiently to allow the particles in the self-doping metal paste to move through the via and contact the underlying silicon wafer. Further, if the via size is too small, the contacts formed through firing of the self-doping metal paste (See, e.g., operation 250 described herein below) may have too high of a resistance to efficiently conduct current generated by a solar cell produced through the method of FIG. 2. An upper constraint on the size of the via may be imposed due to the size of the metal grid line produced through application and firing of self-doping metal paste over the via. In this regard, too large of a grid line may undesirably shade a greater percentage of the solar cell surface and negatively impact efficiency of the solar cell.

Figure 5:
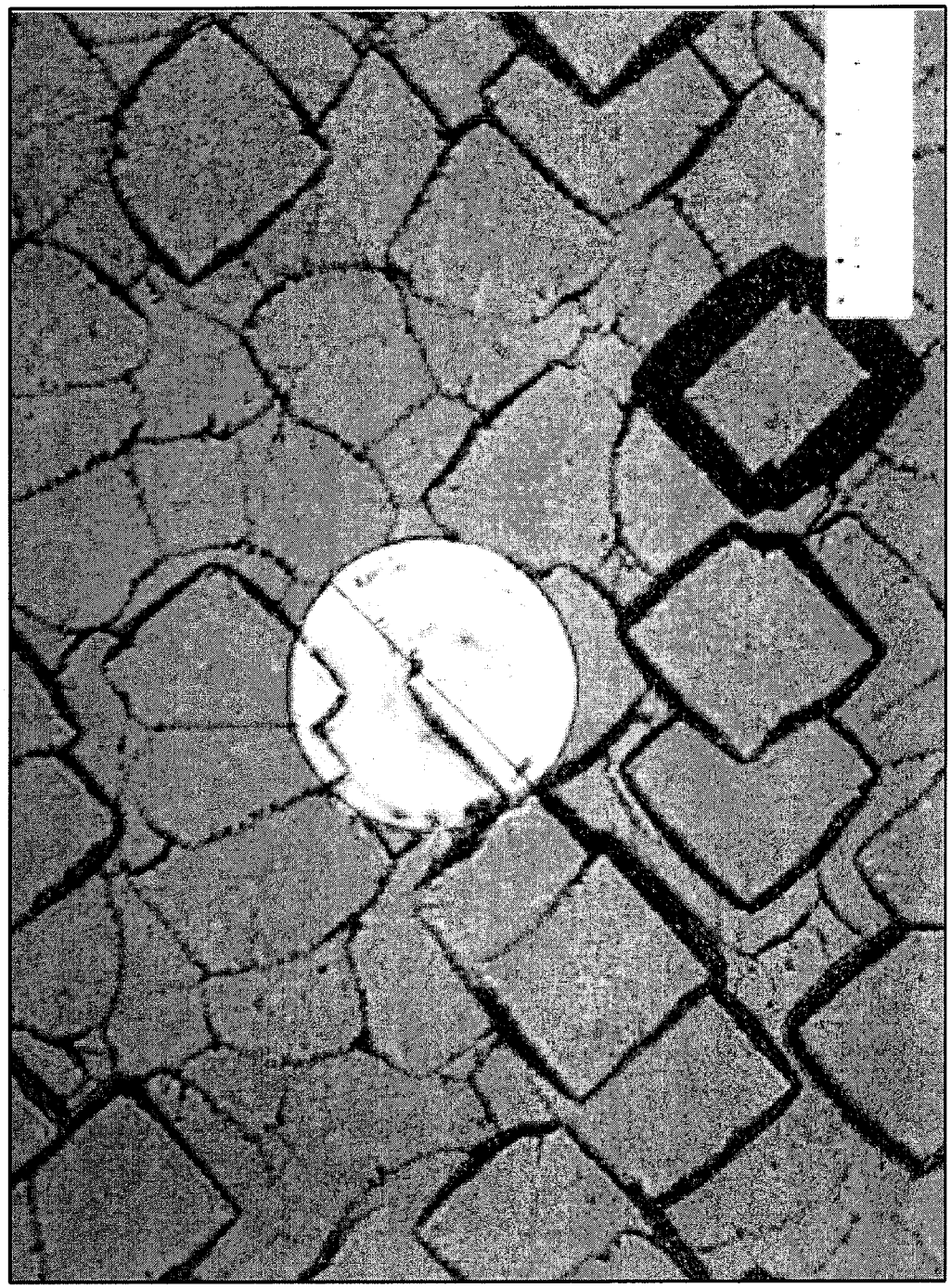
FIG. 5 illustrates a substantially round via formed through a silicon nitride dielectric layer according to an exemplary embodiment of the invention.
Figure 6:
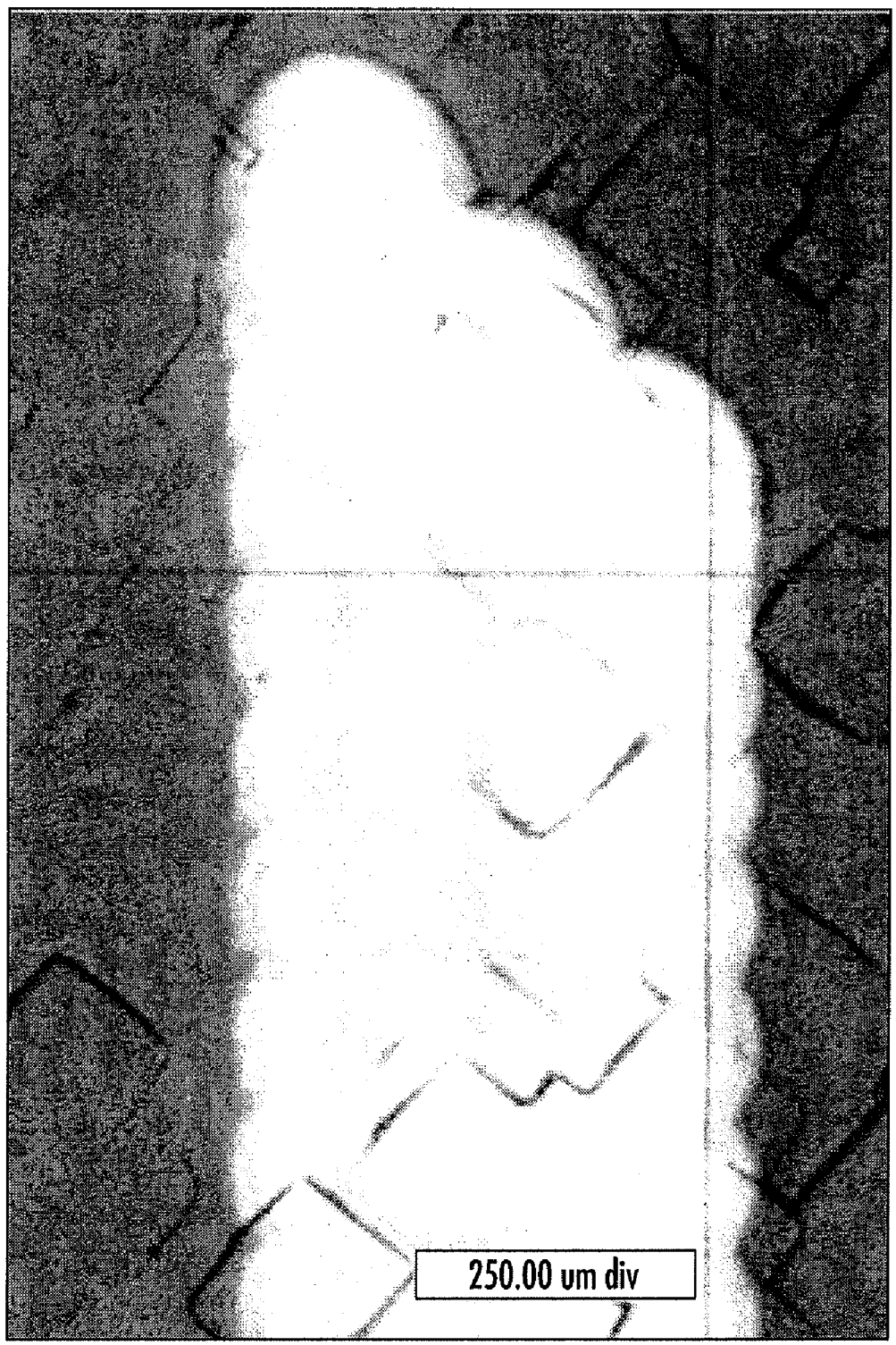
FIG. 6 illustrates a substantially linear via formed through a silicon nitride dielectric layer according to an exemplary embodiment of the invention.

In some embodiments, vias having a substantially round shape are formed using a single laser pulse. These substantially round vias may have a diameter of about 20 to 100 microns. In an exemplary embodiment the diameter of the substantially round vias is about 75 microns. In this regard, FIG. 5 illustrates a substantially round via (the white circle) formed through a silicon nitride dielectric layer (the black background) according to an exemplary embodiment of the invention. It will be appreciated, however, that embodiments of the invention are not limited to vias having a substantially round shape. In an alternative embodiment, for example, vias having a substantially linear shape are formed. For example, FIG. 6 illustrates a via having a substantially linear shape formed using overlapping laser pulses according to an exemplary embodiment of the invention.

A solar cell formed according to the process illustrated in FIG. 2 may require the formation of multiple vias. Accordingly, between formation of each via, the laser focus needs to be adjusted such that the laser is focused on the next desired via location. The wafer and/or the laser may be mechanically moved as described previously. However, mechanical movement of the wafer and/or laser may not be desirable for commercial solar cell production due to the additional time required for mechanical movement. Accordingly, in an exemplary embodiment, the laser is refocused through adjustment of a scan head, which may be quicker than mechanical movement of the silicon wafer and/or laser and thus may increase throughput. The scan head may, for example, comprise a galvo scan head, a polygonal scan head (e.g., a polygonal scanning system), or the like. This process of focusing the laser using a scan head is sometimes referred to as "rastering the laser." Additionally or alternatively, multiple lasers may be used in parallel such that multiple vias may be simultaneously formed so as to increase throughput.

After completion of operation 220, a wet etch cleaning step (not illustrated in FIG. 2) may be performed on the front surface of the silicon wafer. However, wet etch cleaning may not be needed depending on what type of laser was used in operation 220 and/or on what type of self-doping metal paste is applied in operation 230 as described below. Accordingly, the wet etch cleaning step is not performed following operation 220 in some embodiments of the invention.

Operation 230 comprises applying a self-doping metal paste to a portion of the front surface such that the self-doping metal paste is applied to the vias formed in operation 220. In this regard, the self-doping metal paste may be applied in any appropriate arrangement for forming front side contacts on the silicon wafer. In an exemplary embodiment, the self-doping metal paste is applied in a grid pattern overlying the vias such that contacts through the dielectric layer are formed and current produced by a solar cell fabricated in accordance with embodiments of the invention is carried by the grid pattern.

The self-doping metal paste may comprise a silver paste. However, it will be appreciated that silver paste is provided for purposes of example and may be substituted for another conductive paste material for forming the front-side contacts. The self-doping metal paste further comprises a dopant. Ideally, the dopant in the self-doping metal paste has the same charge carrier type as was used to dope the front surface of the silicon wafer to form the P-N junction in operation 200. Application of the self-doping metal paste to the portions of the front surface of the silicon wafer exposed by the vias advantageously may re-dope the exposed wafer surface if the via formation shorted the P-N junction. Application of the self-doping metal paste may further form a selective emitter region at the via site having a higher dopant concentration than a region of the front surface of the silicon adjacent to the via site. In an exemplary embodiment, such as that described by way of example with respect to operation 200, wherein a P-type silicon wafer is doped on the front side with an N-type dopant to form a P-N junction, the self-doping metal paste comprises an N-type dopant. The N-type dopant mixed with the metal paste to form N-type self-doping metal paste may comprise, for example, phosphorus, arsenic, antimony, any combination thereof, and/or the like. Example N-type self-doping silver pastes that may be used in accordance with embodiments of the present invention include silver paste model number PV167 and PV168 manufactured by DuPont Corporation. It will be appreciated, however, that a self-doping metal paste comprising a P-type dopant may also be applied within the scope of embodiments of the invention, such as when a silicon wafer initially doped with an N-type dopant is used as a starting substrate. The P-type dopant mixed with the metal paste to form P-type self-doping metal paste may comprise, for example, indium, aluminum, gallium, boron, any combination thereof, and/or the like. The self-doping metal paste may, for example, be made in accordance with specifications set forth in U.S. Pat. Nos. 6,737, 340; 6,703,295; 6,664,631; 6,632,730; 6,262,359; and 6,180, 869 the contents of which are incorporated herein in its entirety.

In an exemplary embodiment, a fritless self-doping metal paste is applied. In this regard, since vias have been opened through at least one dielectric layer, glass frit may not be needed to eat away at least one dielectric layer. The use of fritless self-doping metal paste, such as for example, the fritless self-doping silver paste model number PV167 manufactured by DuPont Corporation, may be advantageous in that glass fit may function as a getter that consumes dopant mixed with the paste. Accordingly, use of fritless self-doping metal paste may avoid consumption of the dopant and provide for better doping of the silicon surface area exposed by the vias through application of the paste. However, it will be appreciated that embodiments of the invention are not limited to the use of a fritless self-doping metal paste. Accordingly, a fritted self-doping metal paste or a partially fitted self-doping metal paste may be used in addition or in lieu of a fritless self-doping metal paste. When fritless self-doping metal paste is used, a cleaning step (e.g., a wet etch cleaning step) may be performed prior to application of the self-doping metal paste.

The self-doping metal paste may be applied in accordance with any appropriate application method. In an exemplary embodiment, the self-doping metal paste is applied to a portion of the front surface of the silicon wafer by screen printing the self-doping metal paste with an appropriately configured screen printer. One screen printer that may be used to apply self-doping metal paste in accordance with embodiments of the invention is the ASYS Incorporated Model STS X5 screen printer.

Prior to screen printing the self-doping metal paste, the silicon wafer may be placed in a tray or other receptacle of the printer such that the self-doping metal paste may be printed on at least a portion of the front surface of the silicon wafer. The wafer and/or printer screen may then be aligned such that self-doping metal paste will be printed to the desired portion(s) of the silicon wafer to form the contact(s). This alignment may be performed at least in part, for example, using edge alignment. In this regard, the edge of the silicon wafer may be identified and then the wafer may be aligned based on the identified edge position. In another example, the alignment may be performed at least in part by using center alignment to align the silicon wafer. In this regard, an optical detection device (e.g., a camera) may be used to identify the center of the silicon wafer and then the center of the wafer is aligned to a predetermined position. As a further example, the wafer may include fiducial marks, which may be identified using an optical detection means, such as a camera. The identified fiducial marks may be used to align the wafer.

The print settings used for printing the self-doping metal paste may vary depending on any number of factors, such as, for example, thickness of the wafer, the type of self-doping metal paste used, the type of screen used, the model of screen printer used, and/or other factors that may affect printing of the self-doping metal paste. In at least some embodiments, a printer squeegee having a hardness somewhere in a range of about 60 to 80 Durometers is used. An example screen that may be used in the screen printer comprises a mesh count of about 290, about 0.8 millimeter diameter wire, and about 1 millimeter mil (25 μm) emulsion thickness with about 20 to 25 Newtons of screen tension. Further, a print speed having a value in a range from about 100 millimeters per second to about 200 millimeters per second may be sued. The print pressure applied by the printer squeegee may have a value in a range from about 50 Newtons to about 80 Newtons. Additionally, a snap off setting somewhere in a range of about 1.0 to 2.0 millimeters may be used. The snap off setting may be adjusted to optimize printing of the self-doping metal paste. In this regard, a snap off setting may be chosen such that the screen does not contact the silicon wafer prior to application of the squeegee during printing, but that is still sufficient to facilitate printing an optimally crisp and fine line of self-doping metal paste to the wafer. It will be appreciated, however, that these print settings and configurations are provided by way of example and not by limitation. Accordingly, depending on the conditions and application specific requirements, different print settings and configurations may be used within the scope of the invention.

After applying the self-doping metal paste, the self-doping metal paste may be dried, at operation 240. It will be appreciated that drying of the self-doping metal paste may be performed in any number of ways including, for example, setting aside the wafer for a sufficient amount of time to allow the self-doping metal paste to dry before performing any additional work on the wafer. However, in order to reduce the amount of time required to produce a solar cell using embodiments of the present invention, the self-doping metal paste may be actively dried using a heat source. In an exemplary embodiment, the wafer is placed in a belt furnace to facilitate drying of the self-doping metal paste. The wafer may be placed in the belt furnace at any temperature and for any amount of time sufficient to dry the self-doping metal paste. In exemplary embodiments, the wafer may be placed in a belt furnace having a standard air atmosphere and a temperature setting in a range of about 200 to 250 degrees for a time in a range of about 30 seconds to 1 minute, depending on the rate of travel of the belt of the belt furnace. It will be appreciated that these belt furnace settings and conditions are provided by way of example and not by way of limitation. Accordingly, other settings may be used to dry the applied self-doping metal paste in accordance with embodiments of the invention. Further, in some embodiments, the self-doping metal paste may be dried concurrent with operation 250 as described below.

Operation 250 comprises heating the silicon wafer and applied self-doping metal paste to form front side contacts and selective emitter regions self-aligned to the overlying front side contacts. In this regard, the silicon wafer and applied self-doping metal paste may be heated to a temperature to drive at least some dopant from the self-doping metal paste into the portions of the front surface of the semiconductor wafer exposed by the vias to form a selective emitter region and to form contacts overlying and self-aligned to the selective emitter regions. The contacts may be in electrical contact with the P-N junction at the via locations such that current produced by a solar cell fabricated in accordance with embodiments of the invention is carried away by the contacts. This heating process performed in operation 250 is also referred to as "firing" and may be performed in a firing furnace, such as, for example, the Despatch Industries model CDF-7210 firing furnace.

Figure 7:
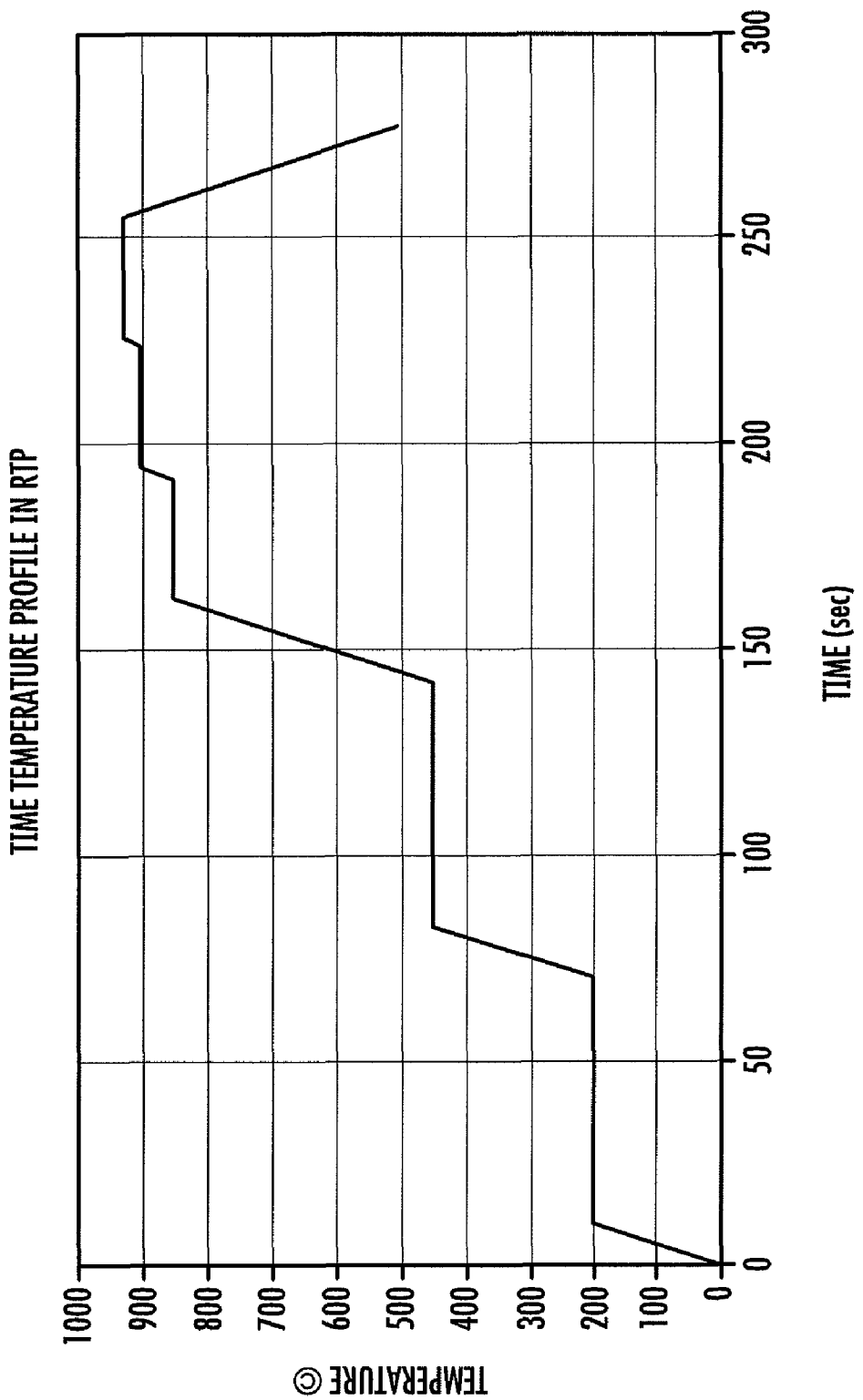
FIG. 7 illustrates a thermal profile for firing front side contacts and forming a selective emitter region self-aligned to the front side contacts according to an exemplary embodiment of the invention.
Figure 8:
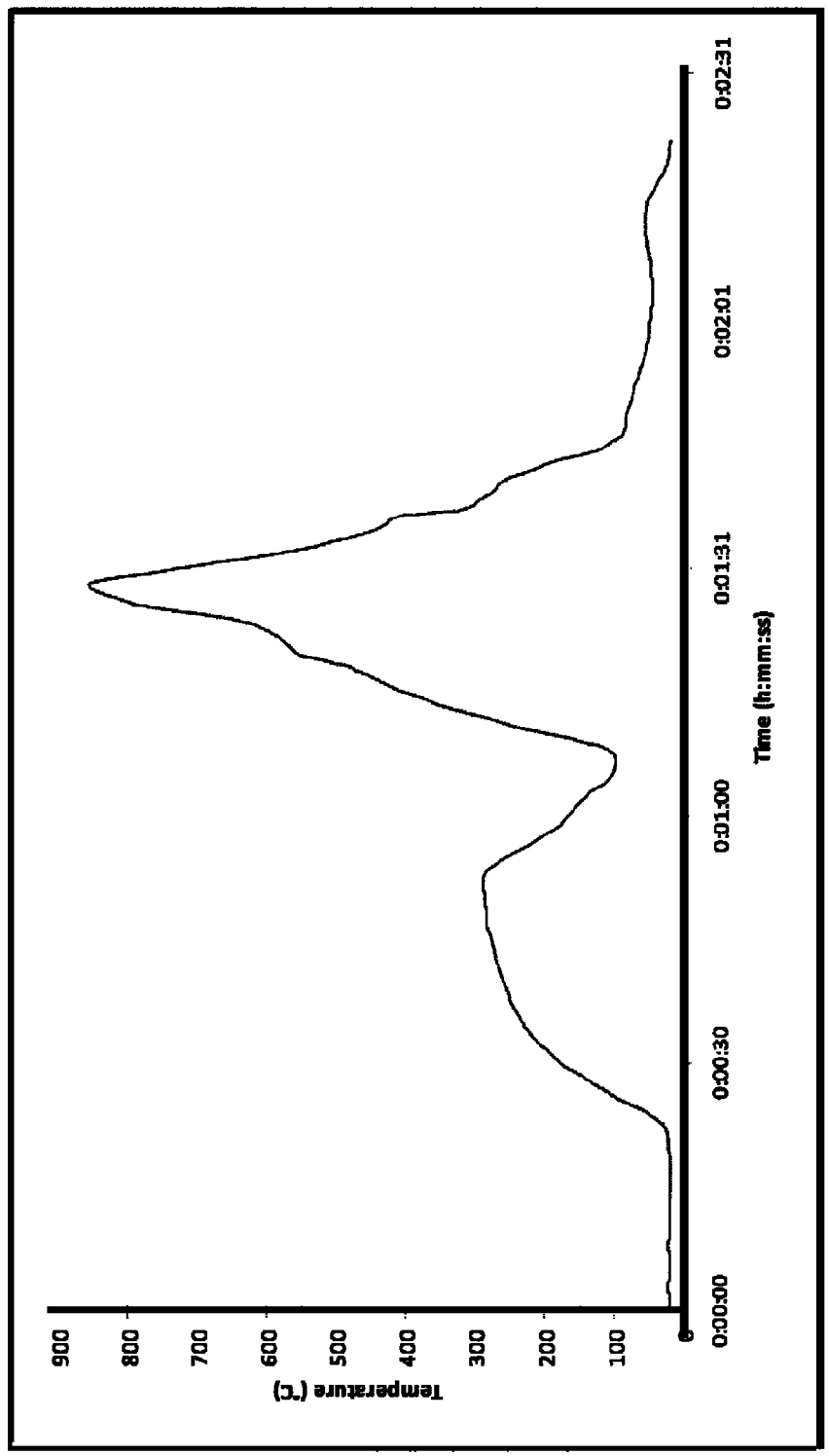
FIG. 8 illustrates a thermal profile for firing front side contacts and forming a selective emitter region self-aligned to the front side contacts according to an exemplary embodiment of the invention.

The wafer and applied self-doping metal paste may be fired in the firing furnace in an inert ambient gas, such as, for example, nitrogen or argon to inhibit oxide formation. Ideally, the wafer and self-doping metal paste are heated to a peak temperature that exceeds the eutectic temperature of the semiconductor material and the conductive material of the self-doping metal paste. In embodiments wherein a silicon wafer and self-doping silver paste are used, the wafer may be heated to a peak temperature exceeding the eutectic temperature for silicon and silver of 835 degrees Celsius. "Peak temperature" as used herein may not comprise a fixed peak temperature, but rather may comprise a variable temperature describing a temperature at or above the relevant eutectic temperature. Accordingly, the period of time at which the wafer is heated at the peak temperature may define a time at which the wafer is heated at a temperature at or above the relevant eutectic temperature rather than a period of time at a fixed temperature. The temperature at which the wafer and applied self-doping metal paste are fired may not exceed the eutectic temperature for the entire heating period. In this regard, the firing temperature may be controlled in accordance with a thermal profile during which the temperature may be ramped up to the peak temperature and then ramped down during a cooling period following a period at the peak temperature. In embodiments wherein a self-doping silver paste is applied to a silicon wafer, the wafer may, for example, be fired for a total period of about 1 to 5 minutes including a period of time at peak temperature of about 10 to 30 seconds. The peak temperature in such embodiments wherein a self-doping silver paste is applied to a silicon wafer may comprise any temperature(s) within a range of about 835 to 980 degrees Celsius. FIG. 7 illustrates a thermal profile for firing front side contacts and forming a selective emitter region self-aligned to the front side contacts according to an exemplary embodiment of the invention. In this regard, FIG. 7 illustrates a thermal profile that has been used for firing a silicon wafer and self-doping silver paste in laboratory conditions. FIG. 8 illustrates another thermal profile for firing front side silver contacts and forming a selective emitter region in a silicon wafer self-aligned to the front side contacts according to an exemplary embodiment of the invention. In this regard, FIG. 8 illustrates a thermal profile that may be useful for commercial production of solar cells in accordance with embodiments of the present invention.

Accordingly, upon completion of operation 250, selective emitter regions are formed at the regions of the semiconductor wafer exposed by the vias and front side contacts are formed that are self-aligned to the underlying selective emitter regions in a single step. The selective emitter regions may have a higher doping concentration than the region of the front surface of the semiconductor wafer adjacent to the selective emitter region, so as to optimally provide for a lower resistance contact to the P-N junction while allowing for a lower doping concentration outside of the contact regions to provide for a greater cell efficiency. Further, if the P-N junction had been shorted at any via site, such as due to ablating too deep of a hole through the P-N junction of the wafer, the dopant driven into the wafer from the self-doping metal paste during firing may serve to reform the P-N junction.

It will be appreciated that although operations 240 and 250 are illustrated in FIG. 2 and described herein as two separate operations, in some embodiments, the applied self-doping metal paste may be dried and fired in a single operation, such as may occur in a firing furnace. In this regard, the ramp up period during which the firing furnace is heated to the peak temperature may function in part to dry the self-doping metal paste. Further, although not illustrated in FIG. 2, back side contacts may also be formed and fired. These back side contacts may be formed prior to operation 250 such that both the front and back side contacts are fired during operation 250. Alternatively, the back side contacts may be fired during a separate firing operation.

FIG. 9 illustrates a series of cross-sectional views of a semiconductor wafer at various stages of the fabrication process according to an exemplary embodiment of the invention. In FIG. 9A, illustrates a P-N junction in a semiconductor wafer initially doped with a first type of charge carrier. In this regard, a layer 910 on the front surface of the semiconductor wafer that is doped with a second type charge carrier opposite to the first type of charge carrier is formed on the semiconductor wafer 900. The junction between layer 900 and layer 910 comprises the P-N junction.

FIG. 9B illustrates a dielectric layer 920 formed over on the front surface of the semiconductor wafer overlying the layer 910. Additionally, a dielectric layer 930 may be formed on the back surface of the semiconductor wafer. It will be appreciated that the dielectric layer 920 and/or dielectric layer 930 may comprise a plurality of dielectric layers.

Figure 9E:
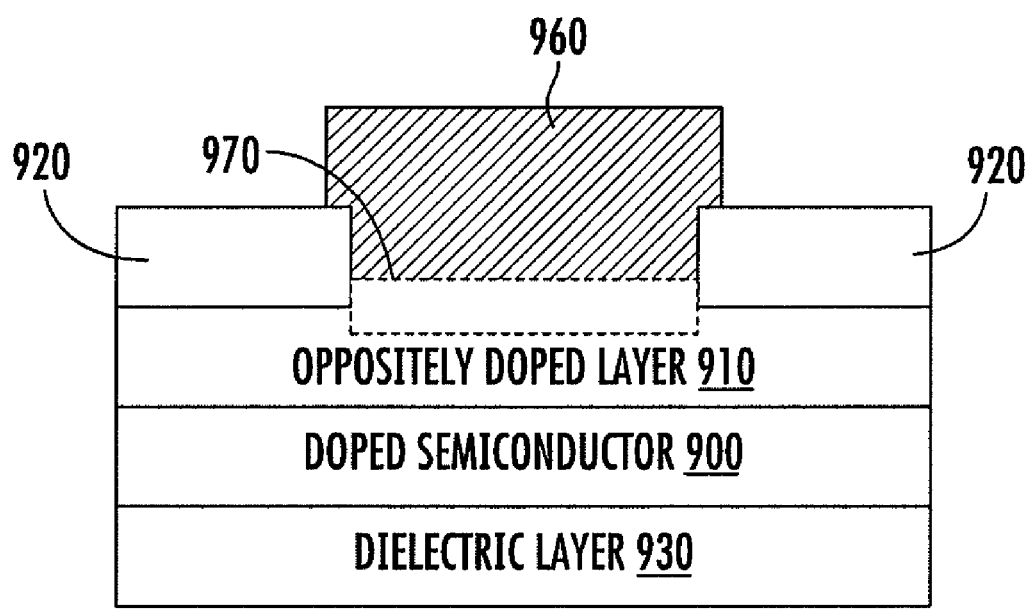
FIG. 9 illustrates a series of cross-sectional views of a semiconductor wafer at various stages of the fabrication process according to an exemplary embodiment of the invention.

A via 940 is formed through ablation of a region of the dielectric layer 920, as illustrated in FIG. 9C. FIG. 9D illustrates the application of self-doping paste 950 to the via. Finally, FIG. 9E illustrates a fired contact 960 after the semiconductor wafer and applied self-doping metal paste have been fired, such as described in operation 250. In this regard, firing of the semiconductor wafer and applied self-doping metal paste 950 has produced the contact 960 and a heavily doped selective emitter region 970 underlying and self-aligned to the contact 960.

Figure 10A:
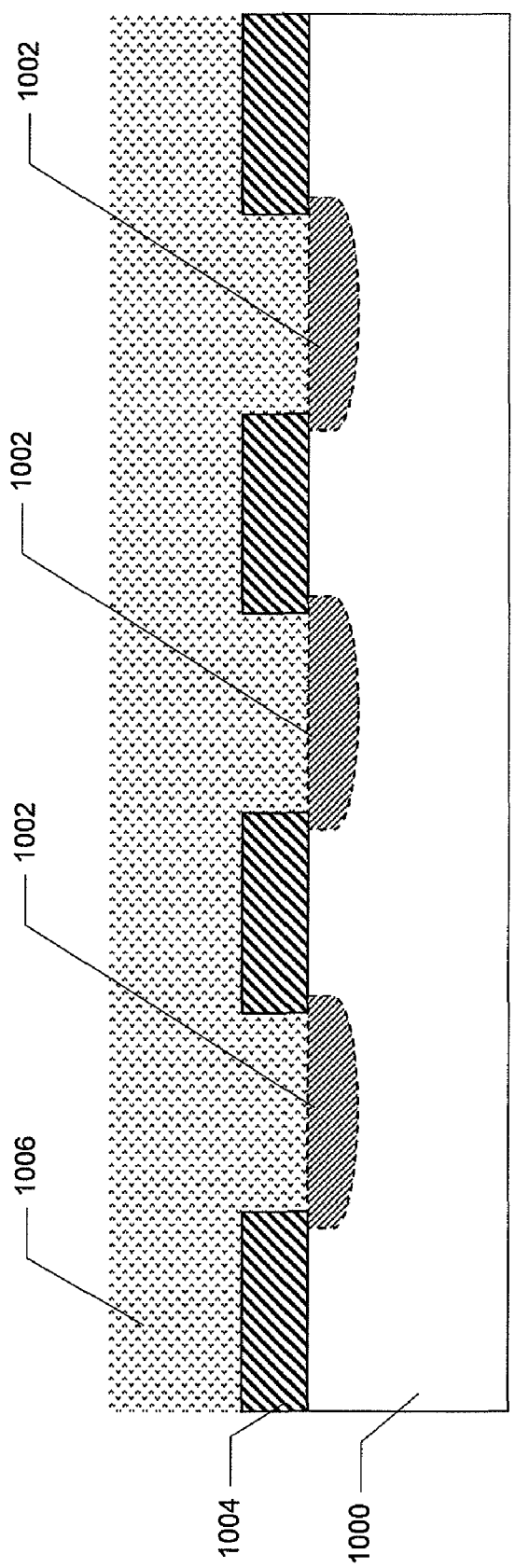
FIG. 10a illustrates a cross-sectional view of a solar cell fabricated according to an exemplary embodiment of the invention.

FIG. 10a illustrates a cross-sectional view of a solar cell fabricated according to an exemplary embodiment of the invention. The solar cell of FIG. 10a comprises a semiconductor wafer substrate 1000 and an overlying dielectric layer 1004. A metal contact grid line 1006, such as may be formed using self-doping metal paste, overlies a portion of the dielectric layer 1004. As illustrated, the metal contact grid line 1006 is in electrical contact with the P-N junction of the semiconductor wafer substrate 1000 at the selective emitter regions 1002. The selective emitter regions 1002 are discontinuous and substantially underlie vias formed in the dielectric layer 1004. The discontinuous selective emitter regions 1002 may be formed by application of self-doping metal paste for forming the metal contact grid line 1006 over the vias formed through the dielectric layer 1004.

Figure 10B:
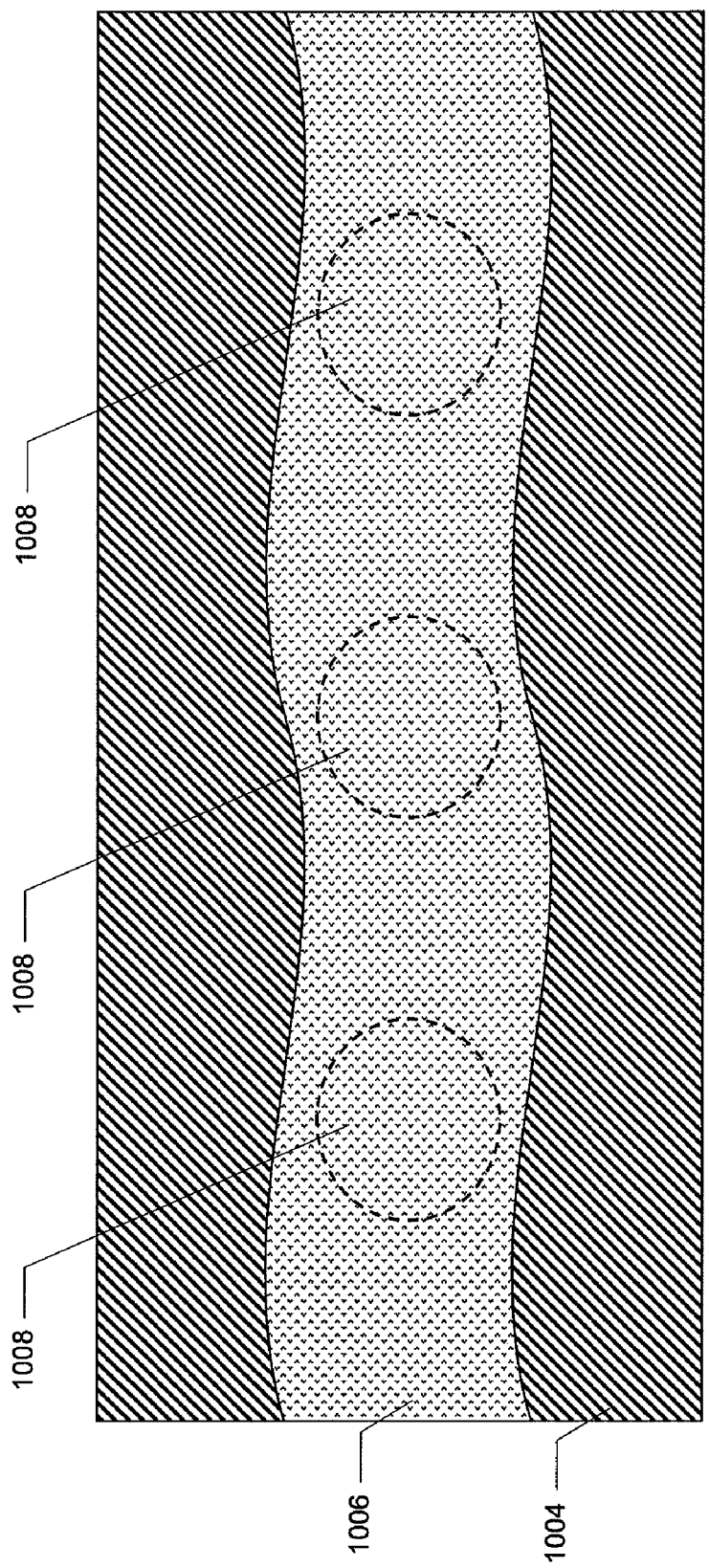
FIG. 10b illustrates a top-down view of a solar cell fabricated according to an exemplary embodiment of the invention.

FIG. 10b illustrates a top-down view of a solar cell fabricated according to an exemplary embodiment of the invention. In this regard, FIG. 10b may comprise a top-down view of the solar cell illustrated in FIG. 10a. The solar cell illustrated in FIG. 10b comprises a dielectric layer 1004 on the front (e.g., top) surface of the solar cell. A metal contact grid line 1006 overlies a portion of the surface of the dielectric layer 1004. The metal contact grid line 1006 may be in electrical contact with the P-N junction of the underlying semiconductor wafer substrate through a plurality of discontinuous vias. Although these vias are not visible when viewing a front (e.g., top) surface of a solar cell formed in accordance with an example embodiment of the invention, a plurality of discontinuous vias 1008 are illustrated in FIG. 10b to provide perspective on the location of discontinuous vias substantially underlying a metal contact grid line. These discontinuous vias 1008 may, for example, be performed using laser ablation as described hereinabove.

Many modifications and other embodiments of the inventions set forth herein will come to mind to one skilled in the art to which these inventions pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of steps, elements, and/or materials than those explicitly described above are also contemplated as may be set forth in some of the appended claims. Accordingly, the specification and drawings are to be regarded in an illustrative rather than restrictive sense. Although specific terms are employed herein, they are used in a generic and descriptive sense only and not for purposes of limitation.

What is claimed is:

1. A method comprising:
providing a substrate comprising a semiconductor wafer having a front surface and a back surface and having at least one dielectric layer formed on the front surface of the semiconductor wafer, wherein the semiconductor wafer is initially doped with a first type of charge carrier and comprises a p-n junction formed through doping the front surface of the semiconductor wafer with a second type of charge carrier, the second type of charge carrier being opposite to the first type of charge carrier;
forming a via through the at least one dielectric layer by using a laser to ablate a region of the at least one dielectric layer such that a portion of the front surface of the semiconductor wafer is exposed by the via;
applying a self-doping metal paste to a portion of the substrate such that the applied self-doping metal paste is applied to the via, wherein the self-doping metal paste comprises a dopant comprising the second type of charge carrier; and
heating the substrate and self-doping metal paste to drive at least some dopant from the self-doping metal paste into the portion of the front surface of the semiconductor wafer exposed by the via to form a selective emitter region and to form a contact overlying the selective emitter region, the contact being in electrical contact with the p-n junction at the via location,
wherein the selective emitter region has a higher doping concentration of the second type of charge carrier than a region of the front surface of the semiconductor wafer adjacent to the selective emitter region.

2. The method of claim 1, wherein the self-doping metal paste comprises fritless self-doping metal paste.

3. The method of claim 1, wherein the semiconductor wafer comprises a silicon wafer initially doped with a p-type dopant, wherein the p-n junction is formed by doping the front surface of the semiconductor with an n-type dopant, and wherein the self-doping metal paste comprises an n-type dopant.

4. The method of claim 3, wherein the self-doping metal paste comprises a self-doping silver paste comprising one or more of phosphorus, antimony, or arsenic dopant.

5. The method of claim 1, wherein using the laser to ablate the region of the at least one dielectric layer comprises using the laser to ablate the region of the at least one dielectric layer with a single pulse having a top hat profile or a Gaussian profile.

6. The method of claim 5, wherein the single pulse has a duration between about 1 picosecond and about 30 nanoseconds and a fluence value having a value between about 0.12 Joules per square centimeter and about 5 Joules per square centimeter.

7. The method of claim 1, further comprising aligning one or more of the substrate or the laser such that the via will be formed at a desired location prior to forming the via.

8. The method of claim 1, wherein applying the self-doping metal paste comprises screen printing the self-doping metal paste on the portion of the substrate.

9. The method of claim 8, further comprising aligning one or more of the substrate or a screen of the screen printer such that, when screen printed, the self-doping metal paste will be applied to the via.

10. The method of claim 8, wherein screen printing the self-doping metal paste comprises screen printing the self-doping metal paste using a screen printer comprising:
a squeegee having a hardness of about 60 to 80 Durometers; and
a screen having about a 290 mesh count and comprising 0.8 millimeter wire and 1 millimeter emulsion thickness with a tension of about 20 to 25 Newtons.

11. The method of claim 8, wherein screen printing the self-doping metal paste comprises screen printing the self-doping metal paste using a print speed of about 100-200 millimeters per second, a print pressure of about 50-80 Newtons, and a snap off setting of about 1.0 to 2.0 millimeters.

12. The method of claim 1, wherein heating the substrate and self-doping metal paste comprises heating the substrate and self-doping metal paste to a peak temperature equal to or greater than a eutectic temperature for the semiconductor wafer and metal in the self-doping metal paste.

13. The method of claim 12, wherein the semiconductor wafer comprises a silicon wafer and the self-doping metal paste comprises a self-doping silver paste, and wherein heating the substrate and self-doping metal paste comprises heating the substrate and self-doping metal paste to a peak temperature equal to or greater than 835 degrees Celsius.

14. The method of claim 1, wherein the at least one dielectric layer comprises one or more of a layer of silicon nitride, a layer of silicon dioxide, a layer of silicon carbide, a layer of silicon oxynitride, hydrogenated amorphous silicon, alloys of hydrogenated amorphous silicon with germanium or carbon, a layer of titanium oxide, a layer of aluminum oxide, or a layer of some combination thereof.

15. The method of claim 1, wherein the p-n junction is formed through doping the front surface of the semiconductor wafer using one or more of ion implantation or thermal diffusion.

16. A solar cell having been at least partially fabricated through a process comprising:
providing a substrate comprising a semiconductor wafer having a front surface and a back surface and having at least one dielectric layer formed on the front surface of the semiconductor wafer, wherein the semiconductor wafer is initially doped with a first type of charge carrier and comprises a p-n junction formed through doping the front surface of the semiconductor wafer with a second type of charge carrier, the second type of charge carrier being opposite to the first type of charge carrier;
forming a via through the at least one dielectric layer by using a laser to ablate a region of the at least one dielectric layer such that a portion of the front surface of the semiconductor wafer is exposed by the via;
applying a self-doping metal paste to a portion of the substrate such that the applied self-doping metal paste is applied to the via, wherein the self-doping metal paste comprises a dopant comprising the second type of charge carrier; and heating the substrate and self-doping metal paste to drive at least some dopant from the self-doping metal paste into the portion of the front surface of the semiconductor wafer exposed by the via to form a selective emitter region and to form a contact overlying the selective emitter region, the contact being in electrical contact with the p-n junction at the via location, wherein the selective emitter region has a higher doping concentration of the second type of charge carrier than a region of the front surface of the semiconductor wafer adjacent to the selective emitter region.

17. The solar cell of claim 16, wherein the self-doping metal paste comprises fritless self-doping metal paste.

18. The solar cell of claim 16, wherein the semiconductor wafer comprises a silicon wafer initially doped with a p-type dopant, wherein the p-n junction is formed by doping the front surface of the semiconductor with an n-type dopant, and wherein the self-doping metal paste comprises an n-type dopant.

* * * * *